(12) United States Patent
Kwon

(10) Patent No.: US 6,925,020 B2
(45) Date of Patent: Aug. 2, 2005

(54) SEMICONDUCTOR MEMORY DEVICE HAVING SENSE AMPLIFIER AND METHOD FOR OVERDRIVING THE SENSE AMPLIFIER

(75) Inventor: Ki Seop Kwon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 10/737,844

(22) Filed: Dec. 18, 2003

(65) Prior Publication Data

US 2004/0233754 A1 Nov. 25, 2004

(30) Foreign Application Priority Data

May 24, 2003 (KR) ................................ 10-2003-0033157

(51) Int. Cl.[7] ................................................ G11C 7/00
(52) U.S. Cl. ........................ 365/205; 365/203; 365/204
(58) Field of Search ....................... 365/189.09, 189.11, 365/203, 204, 205, 207, 208

(56) References Cited

U.S. PATENT DOCUMENTS 6,115,316 A * 9/2000 Mori et al. ............ 365/230.03
6,304,494 B1 * 10/2001 Arimoto ................ 365/189.09
6,477,100 B2 * 11/2002 Takemura et al. .......... 365/207
6,487,133 B2 * 11/2002 Wada et al. ................ 365/205
6,741,514 B2 * 5/2004 Sako .......................... 365/205
6,754,122 B2 * 6/2004 Wada et al. ................ 365/207

* cited by examiner

Primary Examiner—Son Mai
(74) Attorney, Agent, or Firm—Heller Ehrman LLP

(57) ABSTRACT

A semiconductor memory device comprises a plurality of memory cell arrays, a plurality of sense amplifiers, a connection unit, a driver and an over-driver. The plurality of memory cell arrays comprise a plurality of memory cells. The plurality of sense amplifiers sense and amplify data stored in the plurality of memory cells. The connection unit selectively connects the plurality of sense amplifiers to the plurality of memory cell arrays. The driver drives the sense amplifier to a predetermined voltage. The over-driver applies an overdrive voltage to the driver for a predetermined time after the sense amplifier is temporarily separated from the selected memory cell array. In the semiconductor device since data in a bitline can be rapidly amplified, the restoration time of data stored in a memory cell is reduced, and the parameter tRCD. Accordingly, the operation speed of the semiconductor memory device can be improved.

10 Claims, 14 Drawing Sheets

US 6,925,020 B2

SEMICONDUCTOR MEMORY DEVICE HAVING SENSE AMPLIFIER AND METHOD FOR OVERDRIVING THE SENSE AMPLIFIER

BACKGROUND OF THE INVENTION

1. Field of the Invention

The present invention generally relates to a semiconductor memory device having a sense amplifier and a method for overdriving the sense amplifier, and more specifically, to a semiconductor memory device having a sense amplifier and a method for overdriving the sense amplifier for effectively amplifying data of a bitline, thereby improving output time of data and reducing a precharge time.

2. Description of the Prior Art

FIG. 1 is a block diagram illustrating a general semiconductor memory device.

The conventional semiconductor memory device comprises a memory block 1 including a plurality of memory cell arrays and a control block 2 for storing data in the memory block 1 and outputting the data stored in the memory block 1.

The memory block 1 comprises a plurality of memory cell arrays 3a and 3b each including a plurality of memory cells, and sense amplifier arrays 4 including a plurality of sense amplifiers for amplifying data stored in the memory cells.

The control block 2 comprises a row controller 5 for selecting a wordline, a column controller 6 for selecting a bitline, and an output unit 7 for outputting data.

To improve integrity of the semiconductor memory device, one sense amplifier array 4 is arranged between the two memory cell arrays 3a and 3b. The sense amplifier array 4 is connected to the selected memory cell array 3a in response to a previously set connection signal.

FIG. 2 is a block diagram illustrating the sense amplifier array 4 of FIG. 1.

The sense amplifier array 4 comprises a plurality of sense amplification unit 8. Each sense amplification unit 8 comprises a sense amplifier 9, a data output unit 10, a precharge unit 11, switch units 12a and 12b and equalization unit 13a and 13b. The data output unit 10 outputs data amplified by the sense amplifier 9 into a data bus DB. The precharge unit 11 precharges and equalizes bitlines BLs and /BLs of the sense amplifier array 4. The switch units 12a and 12b selectively connects the sense amplifier 9 to the selected memory cell arrays 3a and 3b. The equalization unit 13a and 13b equalizes bitlines Bla, /BLa and BLb, /BLb in the memory cell arrays 3a and 3b, respectively.

The sense amplifier array 4 comprises a sense amplifier controller 14 for selectively driving the sense amplifier 9, and a switch controller 15 for controlling the switch units 12a and 12b. Here, the sense amplifier 9 has a latch type.

The data output unit 10, which is controlled by a column selecting signal YI outputted from the column controller 6, transmits data amplified by the sense amplifier 9 into the data bus DB.

The precharge unit 11, which is controlled by a bitline equalization signal BLEQ, precharges and equalizes bitlines BLs and /BLs of the sense amplifier array 4 to a bitline precharge voltage VBLP.

The equalization units 13a and 13b, which are controlled by bitline equalization signals BLEQH and BLEQL, equalizes the bitlines BLa, /BLa and BLb, /BLb of the corresponding memory cell arrays 3a and 3b, respectively.

The sense amplifier controller 14 generates control signals RTO and /S to selectively activate the sense amplifier 9.

The switch controller 15 generates connection signals BISH and BISL to selectively connect the sense amplifier array 4 to the selected memory cell arrays 3a and 3b, respectively.

A capacitor C represents load capacitance generated in each bitline.

FIG. 3 is a circuit diagram illustrating the switch controller 15 of FIG. 2. Here, FIG. 3 shows a part of the switch controller 15 for generating the connection signal BISH to selectively connect the sense amplifier array 4 to the memory cell array 3a. Since the other part of the switch controller 15 for generating the connection signal BISL has the same structure as that for generating the connection signal BISH, the explanation is omitted.

The switch controller 15 comprises a precharge unit 16, a signal generator 17 and an inactivation unit 18. The precharge unit 16 precharges an output terminal BISH to a high level VDD. The signal generator 17 sets the output terminal BISH to a high potential level VPP. The inactivation unit 18 sets the output terminal BISH to a low level VSS.

The high level VDD is a power voltage level used in a common semiconductor memory device. The high potential level VPP is used when a high voltage level is required in a voltage applied to a wordline or a bitline equalization signal, and is an internal power voltage higher than the power voltage VDD. For example, when the power voltage VDD is 2.5V, the high potential power voltage VPP is 3.4V.

The precharge unit 16 comprises an inverter INV1, a level shifter 19 and a PMOS transistor PM1. The inverter INV1 inverts a control signal BLKCOM for precharging the output terminal BISH to the power voltage VDD. The level shifter 19 shifts an output signal from the inverter INV1 to the high potential voltage VPP. The PMOS transistor PM1 precharges the output terminal BISH to the power voltage VDD in response to an output signal from the level shifter 19.

The signal generator 17 comprises an inverter INV2, an NOR gate NR1, an NAND gate ND1, a level shifter 20 and a PMOS transistor PM2. The inverter INV2 inverts a control signal BLKNEXT. The NOR gate NR1 performs an NOR operation on an output signal from the inverter INV2 and a separation control signal BISOFF. The NAND gate ND1 performs an NAND operation on an output signal from the NOR gate NR1 and a control signal BLKSELF. The level shifter 20 shifts an output signal from the NAND gate ND1 to a low potential voltage VBB. The PMOS transistor PM2 sets the output terminal BISH to the high potential voltage VPP in response to an output signal from the level shifter 20.

Since a source of the PMOS transistor PM2 receives the high potential voltage VPP, a gate of the PMOS transistor PM2 receives the high potential voltage VPP other than the power voltage VDD using the level shifter 20. As a result, since the connection signal BISH is not precharged into the power voltage VDD, the mis-operation can be prevented.

The inactivation unit 18 comprises an inverter INV3, an NAND gate ND2 and an NMOS transistor NM1. The inverter INV3 inverts the control signal BLKNEXT. The NAND gate ND2 performs an NAND operation on an output signal from the inverter INV3 and the separation control signal BISOFF. The NMOS transistor NM1 sets the output terminal BISH to a low level-VSS in response to an output signal from the NAND gate ND2.

FIG. 4 is a circuit diagram illustrating an example of the level shifter 19 of FIG. 3. Since the level shifter 20 of the signal generator 17 has the same structure as that of the level shifter 19, the explanation of the level shifter 20 is omitted.

The level shifter 19 comprises PMOS transistors PM3 and PM4, an inverter INV4 and NMOS transistors NM2 and NM3. The cross-coupled PMOS transistors PM3 and PM4 have a common source to receive the high potential voltage VPP. The NMOS transistor NM2 has a drain connected to that of the PMOS transistor PM3, a source to receive the ground voltage VSS, and a gate to receive an output signal IN from the inverter INV1. The inverter INV4 inverts the signal IN. The NMOS transistor NM3 has a drain connected to that of the PMOS transistor PM2, a source to receive the ground voltage VSS, and a gate to receive the output signal from the inverter INV4. An output signal OUT is outputted from a common drain of the PMOS transistor PM4 and the NMOS transistor NM3.

If the output signal IN from the inverter INV1 is at a high level, the NMOS transistor NM2 and the PMOS transistor PM4 are turned on. As a result, the output signal OUT becomes at the high potential level VPP. If the output signal IN from the inverter INV1 is at a low level, the NMOS transistor NM3 and the PMOS transistor PM3 are turned on. As a result, the output signal OUT becomes the ground voltage VSS.

FIG. 5 is a timing diagram illustrating the operation of the switch controller 15 of FIG. 3.

In a precharge interval a, the control signal BLKCOM for controlling the precharge operation of the connection signals BISH and BISL becomes at a high level, and the other signals BLKSELF and BLKNEXT become at a low level. AS a result, the connection signals BISH and BISL are precharged to the power voltage VDD.

The connection signals BISH and BISL are precharged in order to help rapid separation and connection of the sense amplifier array 4 with the memory cell arrays 3a and 3b.

In a connection interval b, the control signal BLKCOM for controlling the precharge operation becomes at a low level, and the other signals BLKSELF and BLKNEXT become at a high level. As a result, the upper connection signal BISH for connecting the sense amplifier array 4 to the selected memory cell array 3a becomes at the high potential level VPP, and the lower connection signal BISL becomes at the low level VSS.

The control signals BLKCOM, BLKNEXT and BLK-SELF are timing signals for generating the connection signals BISH and BISL using a row address.

The control signal BLKCOM is a timing signal for connecting the memory cell arrays 3a and 3b adjacent to the sense amplifier array 4. The control signal BLKSELF is a timing signal for connecting the sense amplifier array 4 to the selected memory cell array 3a. The control signal BLKNEXT is a timing signal for separating the sense amplifier array 4 from the unselected memory cell array 3b.

The separation control signal BISOFF is a timing signal for temporarily separating the sense amplifier array 4 from the selected memory cell array 3a.

After the sense amplifier array 4 is connected to the selected memory cell array 3a, a wordline of the selected memory cell array 3a corresponding to an inputted rwo address is selected. If the selected wordline is activated, data stored in the memory cell connected to the selected wordline is transmitted into the bitline BLa.

Thereafter, the sense amplifier control signals RTO and /S are activated, and the sense amplifier 9 senses and amplifies data on the bitline BLs. Here, the control signal BISOFF for temporarily separating the sense amplifier array 4 from the selected memory cell array 3a is inputted with a pulse type, and the connection signal BISH becomes at a low level temporarily for a high pulse interval c.

As a result, the sense amplifier array 4 is temporarily separated from the selected memory cell array 3a.

Here, since large load capacitance C in the bitline BLs and /BLs decreases, the sense and amplification operations of the sense amplifier 9 can be rapidly performed.

Next, in a connection interval d, the connection signal BISH becomes at a high level, and the sense amplifier array 4 is connected to the selected memory cell array 3a again.

Here, the column selecting signal YI corresponding to the inputted column address is generated to transmit data on the bitline BLs into the data bus DB.

FIG. 6 is a circuit diagram illustrating the sense amplifier controller 14 of FIG. 2.

The sense amplifier controller 14 comprises a precharge unit 21, a PMOS transistor PM5 and an NMOS transistor NM4. The precharge unit 21 precharges and equalizes the control signals RTO and /S to a bitline precharge voltage VBLP in response to the equalization signal BLEQ. The PMOS transistor PM5 pulls up the high level signal RTO to a core voltage VCORE in response to a pull-up control signal /RTOE. The NMOS transistor NM4 pulls down the low level signal /S to the low level VSS in response to a pull-down control signal SZE.

FIGS. 7a and 7b are timing diagrams illustrating the operation of the semiconductor memory device of FIGS. 1 and 2. Here, data stored in the memory cell has a low level.

FIG. 7a is a timing diagram illustrating the operation of the general semiconductor memory device.

When the upper connection signal BISH as the high level VPP and the lower connection signal BISL as the low level VSS are outputted from the switch controller 15, the sense amplifier 9 is connected to the upper memory cell array 3a and separated from the lower memory cell array 3b.

If a wordline of the upper memory cell array 3a is selected and the high level VPP is applied, data stored in the memory cell connected to the selected wordline is loaded in the precharged bitline BLa.

The sense amplifier 9 of the sense amplifier array 4, which is activated by the control signals RTO and /S, senses and amplifies data on the bitline BLs.

The data output unit 10 outputs the amplified data of the bitline BLs corresponding to the column selecting signal YI outputted from the column controller 6 into the data bus DB.

The column controller 6 activates the column selecting signal YI corresponding to the inputted column address.

As a semiconductor memory device becomes higher integrated, one memory cell array 3a or 3b comprises more unit memory cells. As a result, the load capacitance C of the bitline increases.

The sense amplifier 9 requires more time to sense and amplify data of the bitline BLs, which results in delay of the column selecting operation.

Since the timing when the sense amplifier 9 amplifies data on the bitline BLs affects the operation time of the semiconductor memory device, it is importance to minimize the amplification time.

In order to reduce the amplification time of the sense amplifier 9, load capacitance C is reduced.

FIG. 7b is a timing diagram illustrating the operation of the conventional semiconductor memory device when the bitline is separated at the initial stage of the amplification operation to reduce the amplification time of the sense amplifier 9.

After the data stored in the memory cell is loaded in the bitline Bla and BLs, the sense amplifier array 4 is separated from the selected memory cell array 3a before the sense amplifier 9 senses and amplifies the data of the bitline BLs, thereby reducing the load capacitance C of the bitline BLa. As a result, the amplification time of the sense amplifier 9 is reduced.

The connection signal BISH for selectively separating the sense amplifier array 4 from the selected upper memory cell array 3a is set at the low level VSS when the sense amplifier 9 is activated.

The sensing and amplifying operation of the sense amplifier 9 is more rapidly performed when the sense amplifier array 4 is temporarily separated from the selected memory cell array 3a than when the sense amplifier array 4 is not temporarily separated from the selected memory cell array 3a.

As a result, the operation speed of the semiconductor memory device can be improved. A parameter tRCD (Row address to Column address Delay) representing delay time from a row address input to a column address input is improved.

However, as shown in FIG. 7b, the voltage level of the bitline /BLs has a large jitter when the connection signal BISH becomes at a low level temporarily and then transits to a high level.

Additionally, it takes much time to stabilize the bitline voltage due to large load capacitance C of the bitline BLa of the memory cell array 3a.

As a result, since the precharge timing of the bitline is delayed due to restoration time of data in the memory cell, the parameter tRCD is degraded.

SUMMARY OF THE INVENTION

Accordingly, it is an object of the present invention to reduce restoration time of data stored in the memory cell.

It is another object of the present invention to advance a precharge time of a bitline.

It is still another object of the present invention to improve a parameter tRCD.

It is still another object of the present invention to improve operation speed of a semiconductor memory device.

In an embodiment, a semiconductor memory device comprises a plurality of memory cell arrays, a plurality of sense amplifiers, a connection means, a driver and an over-driver. The plurality of memory cell arrays comprise a plurality of memory cells. The plurality of sense amplifiers sense and amplify data stored in the plurality of memory cells. The connection means selectively connects the plurality of sense amplifiers to the plurality of memory cell arrays. The driver drives the sense amplifier to a predetermined voltage. The over-driver applies an overdrive voltage higher than the predetermined voltage to the driver, and the over-driver comprises a timing controller for applying the overdrive voltage to the plurality of sense amplifiers for a predetermined time after the sense amplifier is temporarily separated from a selected memory cell array.

In an embodiment, a method for overdriving a sense amplifier of a semiconductor memory device comprises the steps of: connecting the sense amplifier to a selected memory cell and transmitting data stored in the memory cell into a bitline; sensing and amplifying data transmitted into the bitline; and precharging the bitline after the sense and amplification step. The above sense and amplification step comprises the steps of: separating the sense amplifier from the selected memory cell for a predetermined time; and overdriving the sense amplifier.

BRIEF DESCRIPTION OF THE DRAWINGS

FIG. 10b is a timing diagram illustrating the operation of the overdrive control signal generator of FIG. 10a.

FIG. 11b is a timing diagram illustrating the operation of the overdrive control signal generator of FIG. 11a.

DETAILED DESCRIPTION OF THE PREFERRED EMBODIMENTS

The present invention will be described in detail with reference to the accompanying drawings.

Figure 1:
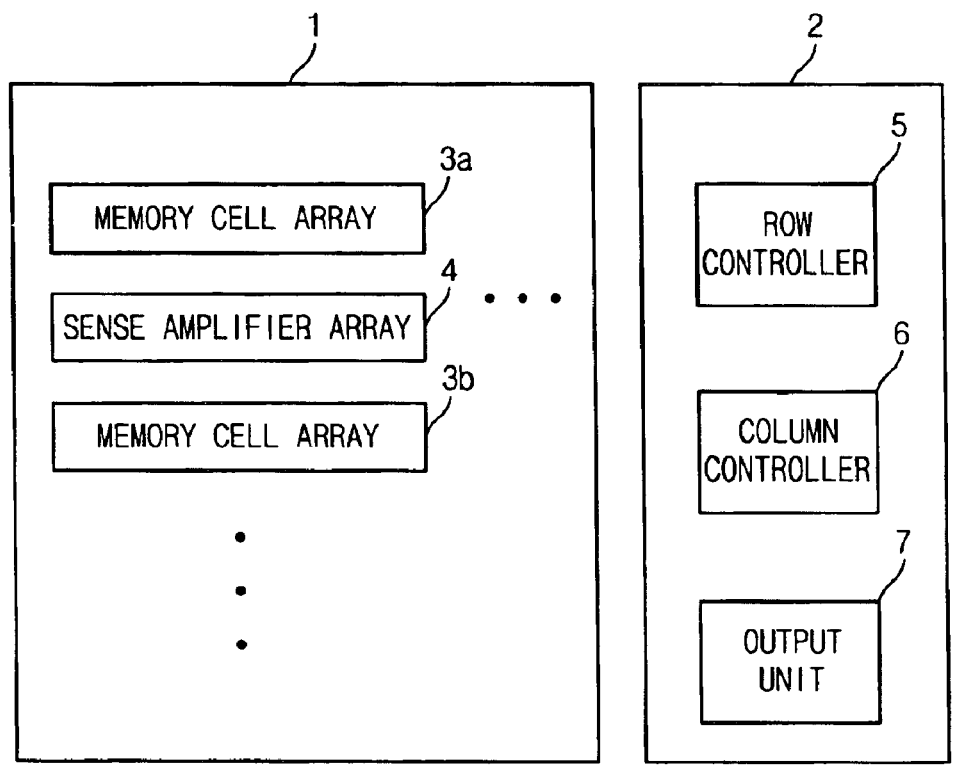
FIG. 1 is a block diagram illustrating a general semiconductor memory device.
Figure 2:
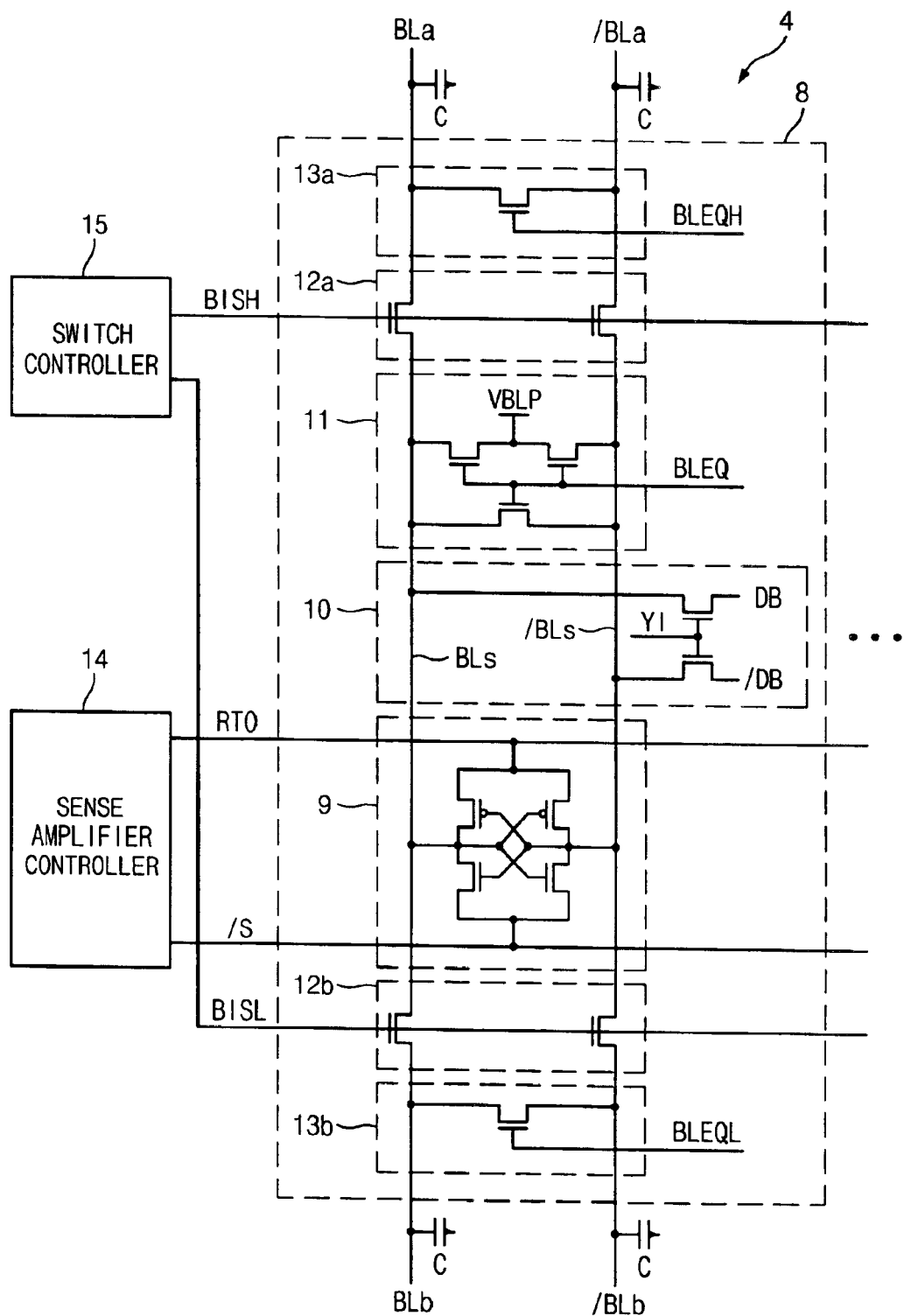
FIG. 2 is a block diagram illustrating a sense amplifier array of FIG. 1.
Figure 3:
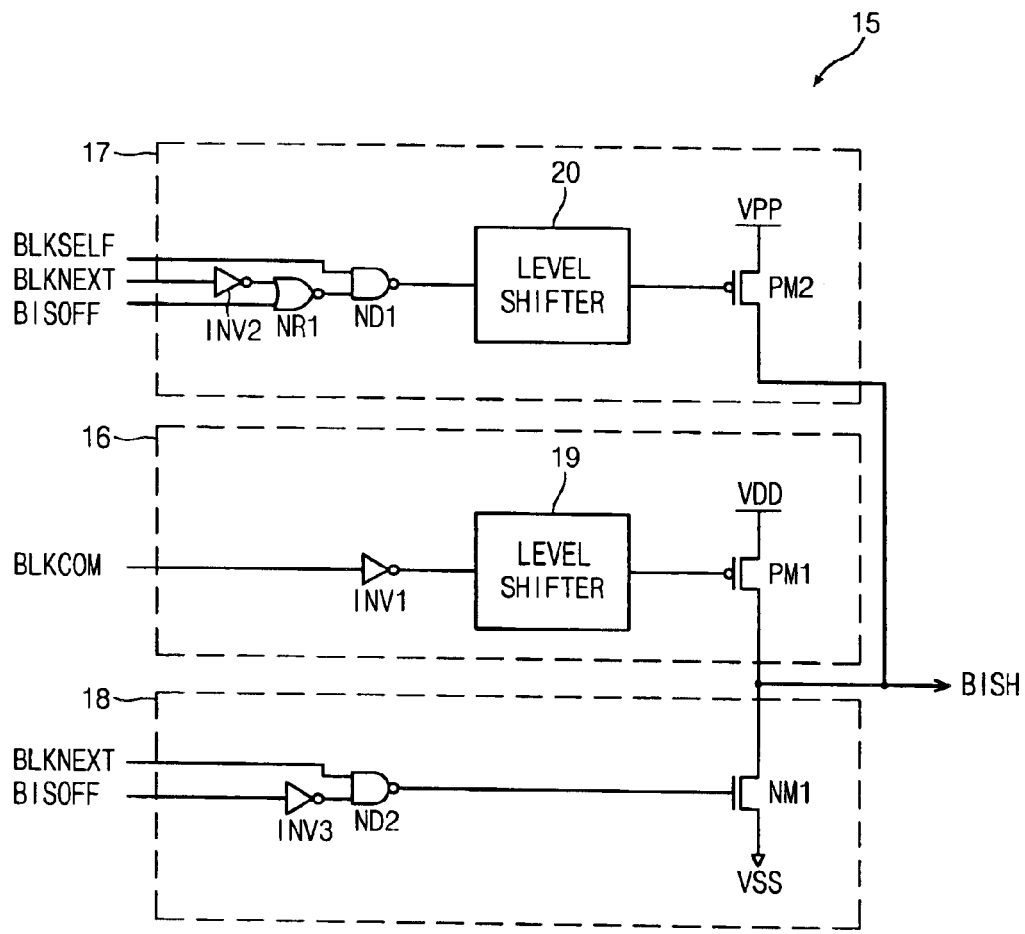
FIG. 3 is a circuit diagram illustrating a switch controller of FIG. 2.
Figure 4:
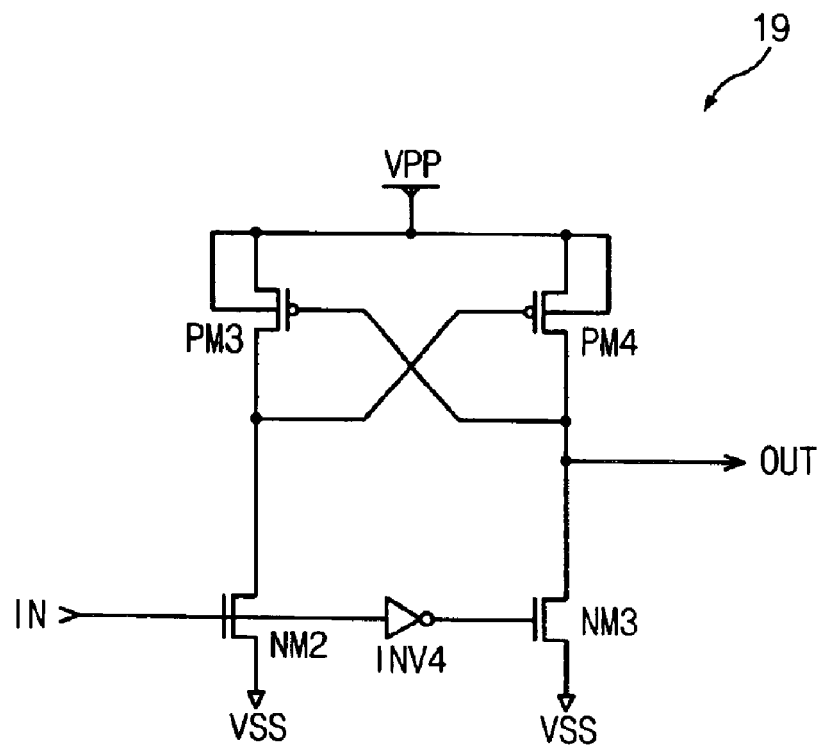
FIG. 4 is a circuit diagram illustrating an example of a level shifter of FIG. 3.
Figure 5:
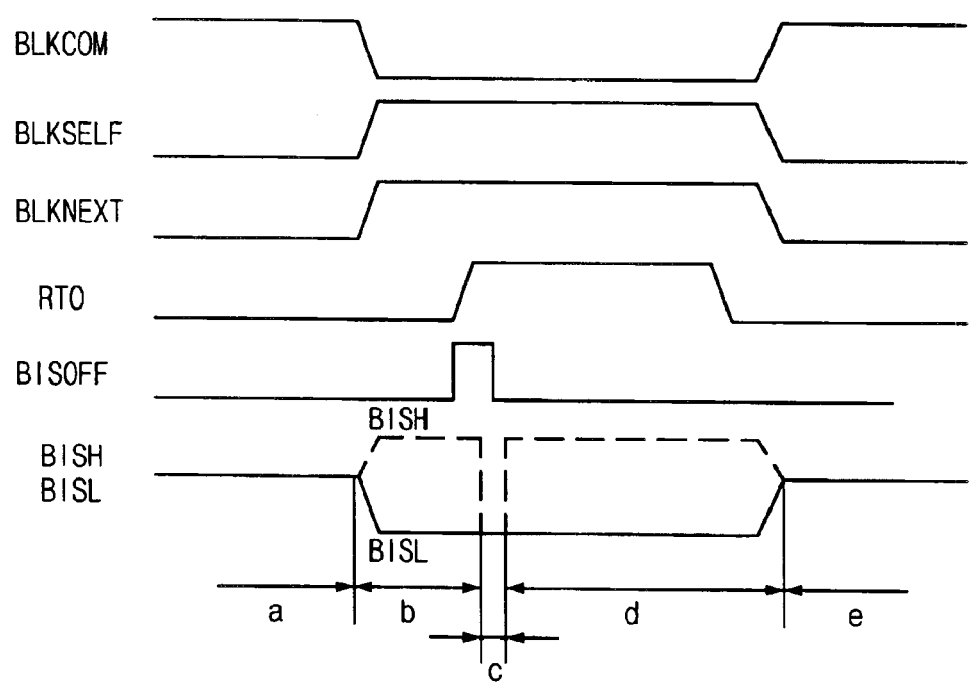
FIG. 5 is a timing diagram illustrating the operation of the switch controller of FIG. 3.
Figure 6:
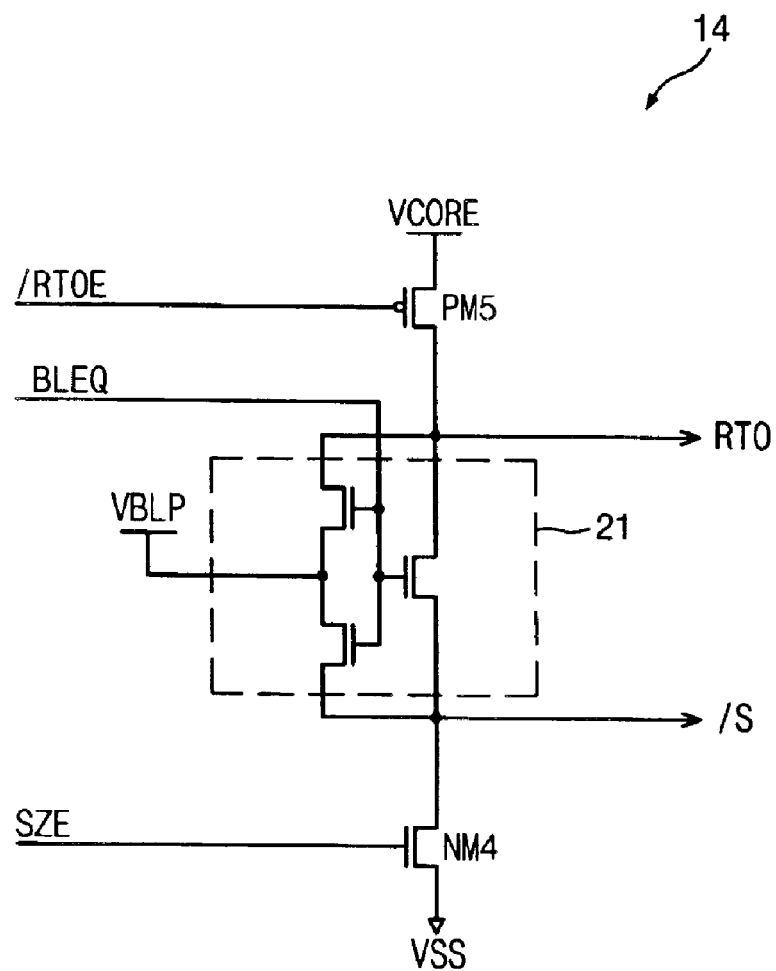
FIG. 6 is a circuit diagram illustrating a sense amplifier controller of FIG. 2.
Figure 7A:
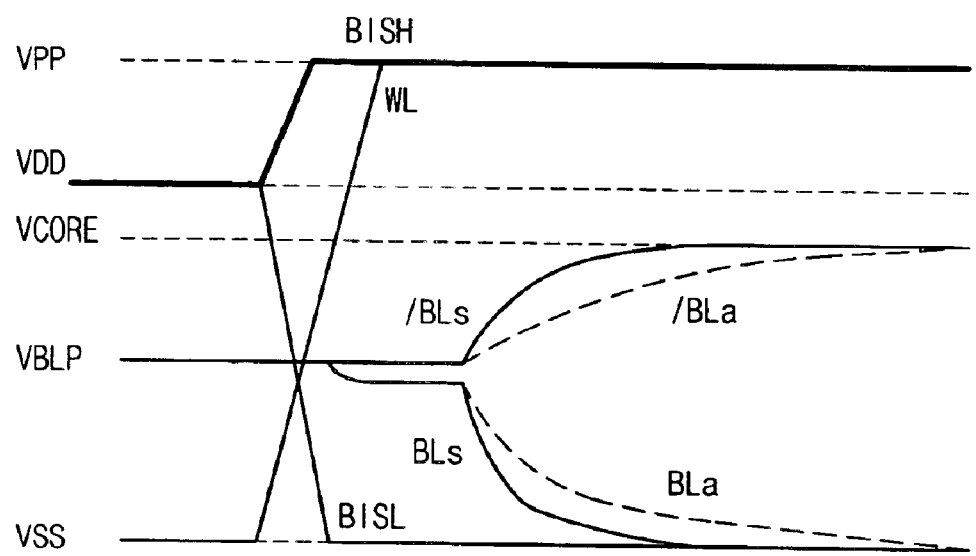
FIGS. 7a and 7b are timing diagrams illustrating the operation of the semiconductor memory device of FIGS. 1 and 2.
Figure 7B:
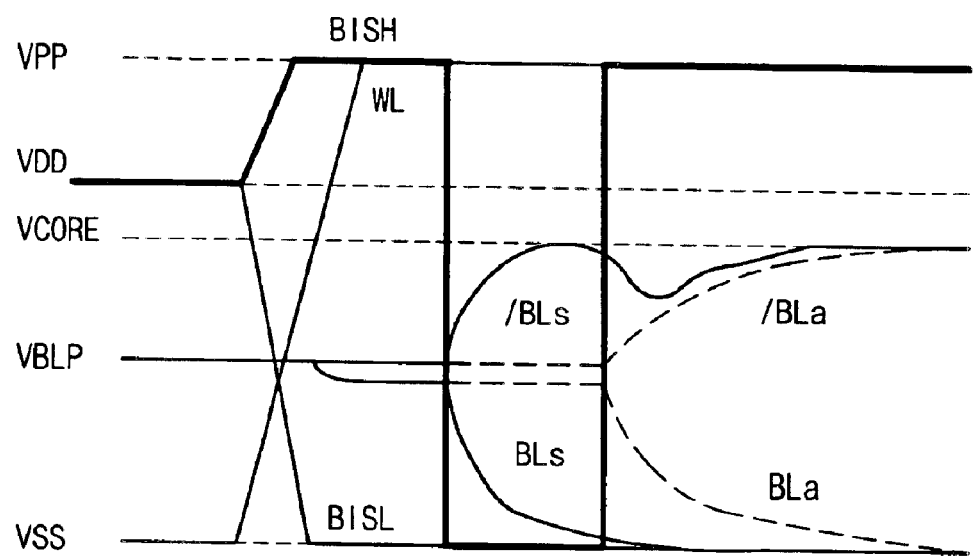
Figure 8:
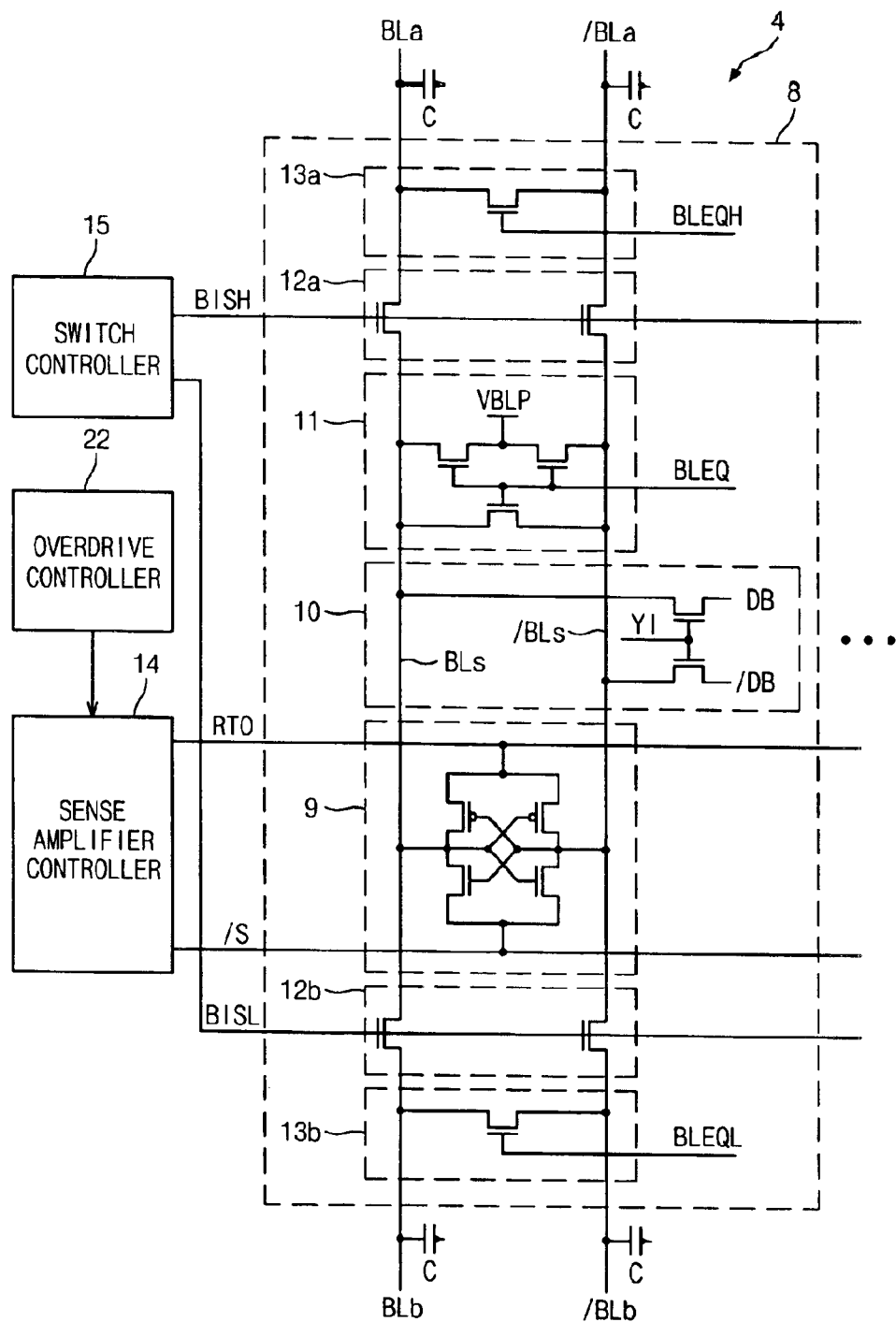
FIG. 8 is a block diagram illustrating a sense amplifier array of a semiconductor memory device according to an embodiment of the present invention.

FIG. 8 is a block diagram illustrating a sense amplifier array 4 of a semiconductor memory device according to an embodiment of the present invention.

In an embodiment, the sense amplifier array 4 comprises a plurality of sense amplifiers 8. Each sense amplifier 8 comprises a plurality of sense amplifiers 9, a data output unit 10, a precharge unit 11, switch units 12a and 12b, and equalization units 13a and 13b. The data output unit 10 outputs data amplified by the sense amplifier 9 into a data bus DB. The precharge unit 11 precharges and equalizes bitlines BLs and /BLs of the sense amplifier array 4 to a bitline precharge voltage VBLP. The switch units 12a and 12b selectively connects the sense amplifier array 4 to selected memory cell arrays 3a and 3b. The equalization units 13a and 13b equalizae bitlines Bla, /BLa and BLb, /BLb of the memory cell arrays 3a and 3b, respectively.

The sense amplifier array 4 further comprises a sense amplifier controller 14, an overdrive controller 22 and a switch controller 15. The sense amplifier controller 14 selectively drives the sense amplifier 9. The overdrive controller 22 outputs a power voltage VDD into the sense amplifier controller 14, and overdrives a control signal RTO. The switch controller 15 controls the switch units 12a and 12b. Here, the sense amplifier 9 is a latch type sense amplifier.

The data output unit 10, controlled by a column selecting signal YI outputted from a column controller 6, transmits data amplified by the sense amplifier 9 into a data bus DB.

The precharge unit 11, controlled by a bitline equalization signal BLEQ, precharges and equalizes the bitlines BLs of the sense amplifier array to a bitline precharge voltage VBLP.

The equalization unit 13, controlled by bitline equalization signals BLEQH and BLEQL, equalizes bitlines Bla, /BLa and BLb, /BLb of the memory cell arrays 3a and 3b, respectively.

The sense amplifier controller 14 generates sense amplifier control signals RTO and /S to selectively activate the sense amplifier 9.

The switch controller 15 generates connection signals BISH and BISL to selectively connect the sense amplifier array 4 to the selected memory cell arrays 3a and 3b, respectively.

A capacitor C represents load capacitance generated in the bitlines BLa and BLb.

Figure 9:
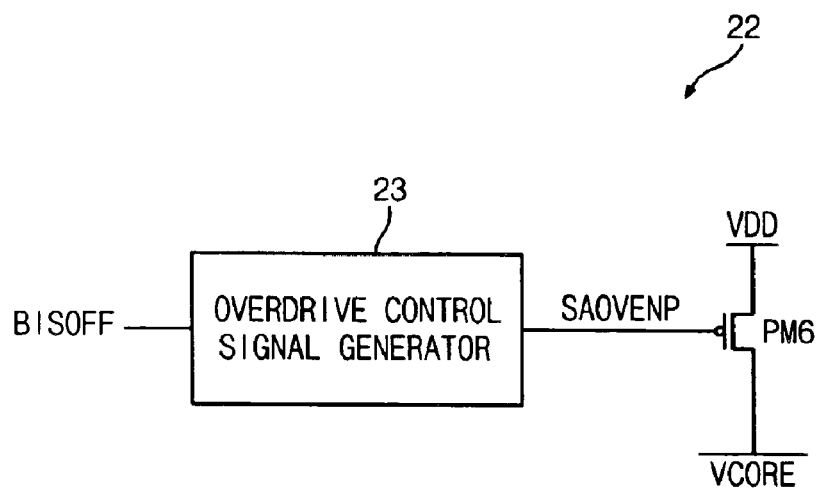
FIG. 9 is a block diagram illustrating an overdriver controller of FIG. 8.

FIG. 9 is a block diagram illustrating the overdriver controller 22 of FIG. 8.

The overdrive controller 22 comprises an overdrive control signal generator 23 and a PMOS transistor PM6. The overdrive control signal generator 23 generates an overdrive control signal SAOVENP in response to a separation control signal BISOFF. The PMOS transistor PM6 drives a core voltage terminal VCORE to a power voltage VDD. The separation control signal BISOFF is a signal for temporarily separating the sense amplifier array 4 from the memory cell array 3a selected in the amplification operation of the sense amplifier. The overdrive control signal SAOVENP is an overdrive timing signal of the sense amplifier control signal RTO.

Figure 10A:
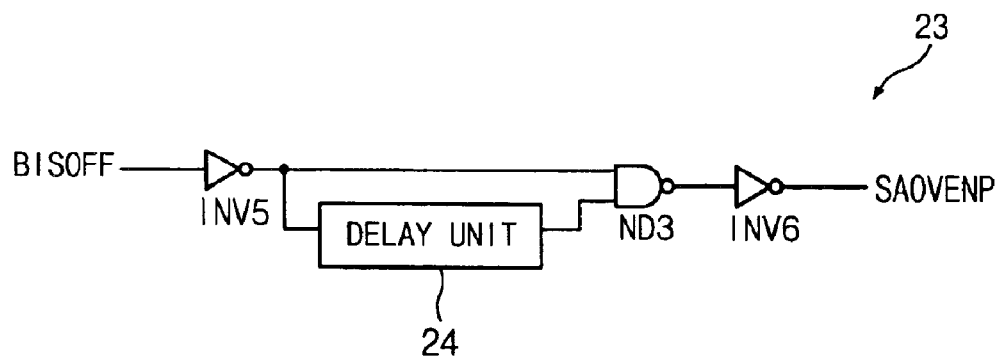
FIG. 10a is a circuit diagram illustrating an example of an overdrive control signal generator of FIG. 9.

FIG. 10a is a circuit diagram illustrating an example of the overdrive control signal generator 23 of FIG. 9.

The overdrive control signal generator 23 comprises inverters INV5 and INV6, a delay unit 24, and an NAND gate ND3. The inverter INV5 inverts the separation control signal BISOFF. The delay unit 24 delays an output signal from the inverter INV5 for a predetermined time DE1. The NAND gate ND3 performs an NAND operation on output signals from the inverter INV5 and the delay unit 24. The inverter INV6 inverts an output signal from the NAND gate ND3 to output the overdrive control signal SAOVENP. Here, the delay unit 24 is a non-inversion delay device comprising the even number of inverters. For example, the delay unit 24 may comprise an inverter chain including 4 inverters.

Figure 10B:
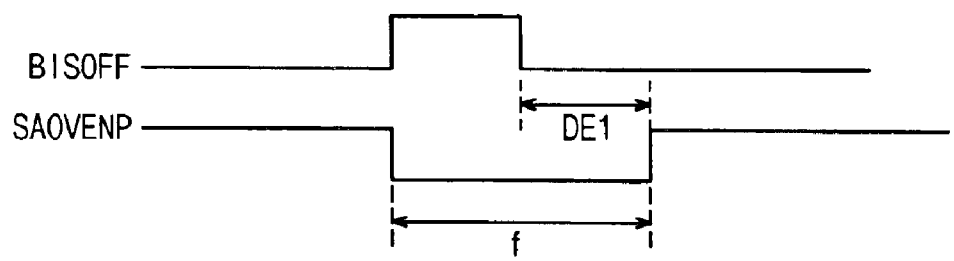

FIG. 10b is a timing diagram illustrating the operation of the overdrive control signal generator 23 of FIG. 10a.

If the separation control signal BISOFF is inputted with a high pulse, the overdrive control signal SAOVENP is generated to have a low pulse width longer than a high pulse width of the separation control signal BISOFF by a delay time DE1 of the delay unit 24.

The sense amplifier control signal RTO is overdriven from the start point of the sense and amplification operation for a predetermined interval f.

Figure 10C:
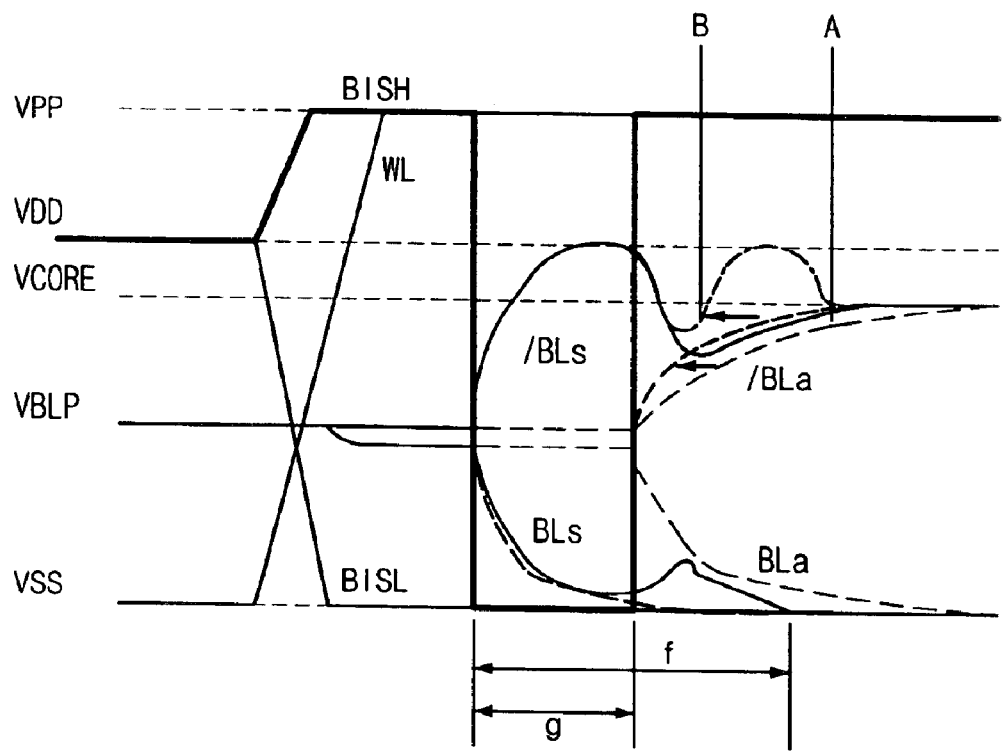
FIG. 10c is a timing diagram illustrating the operation of the semiconductor memory device of FIG. 8 when the overdrive control signal generator of FIG. 10a is used.

FIG. 10c is a timing diagram illustrating the operation of the semiconductor memory device of FIG. 8 when the overdrive control signal generator 23 of FIG. 10a is used.

The sense amplifier control signal RTO is overdriven for a predetermined time f having a delay time DE1 of the delay unit 24 and for an interval where the sense amplifier array 4 is temporarily separated from the selected memory cell array 3a.

As a result, the timing when data of the bitline reach the core voltage VCORE moves from the point A to the point B. That is, since the timing of activation of the column selecting signal YI is advanced, the parameter tRCD is improved.

Figure 11A:
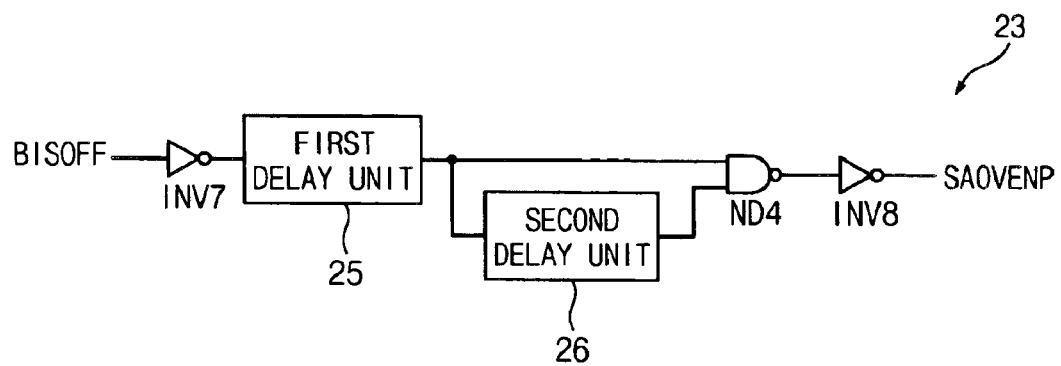
FIG. 11a is a circuit diagram illustrating another example of the overdrive control signal generator of FIG. 9.

FIG. 11a is a circuit diagram illustrating another example of the overdrive control signal generator of FIG. 9.

The overdrive control signal generator 23 comprises inverters INV7 and INV8, delay units 25 and 26 and an NAND gate ND4. The inverter INV7 inverts the separation control signal BISOFF. The first delay unit 25 delays an output signal from the inverter INV5 for a predetermined time DE2. The second delay unit 26 delays an output signal from the first delay unit 25 for a predetermined time DE3. The NAND gate ND4 performed an NAND operation on output signals from the first delay unit 25 and the second delay unit 26. The inverter INV8 inverts an output signal from the NAND gate ND4 to output the overdrive control signal SAOVENP. Here, the delay units 25 and 26 are non-inversion delay units comprising the even number of inverters. For example, the first delay unit 25 comprises an inverter chain including 6 inverters, and the second delay unit 26 comprises an inverter chain including two inverters.

Figure 11B:
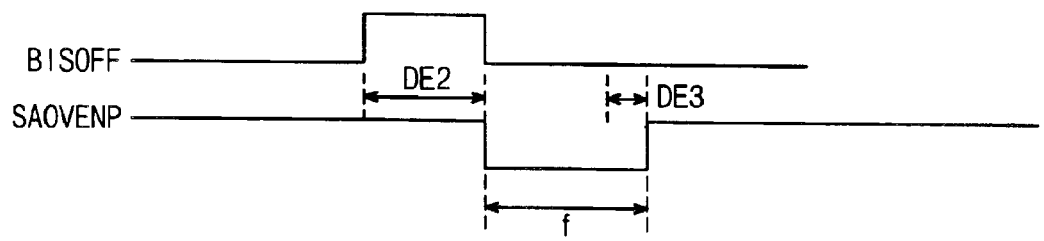

FIG. 11b is a timing diagram illustrating the operation of the overdrive control signal generator 23 of FIG. 11a.

If the separation control signal BISOFF is inputted with a high pulse type, the overdrive control signal SAOVENP having a low pulse width longer than a high pulse width of the separation control signal BISOFF by a delay time DE3 of the second delay unit 26.

The sense amplifier control signal RTO is overdriven after the interval of the delay time DE2 of the first delay unit 25 from the initial stage of the sense and amplification operation of the sense amplifier 9 for a predetermined interval f. The delay time DE2 of the first delay unit 25 is set as an interval while the sense amplifier array 4 is temporarily separated from the selected memory cell array 3a.

Figure 11C:
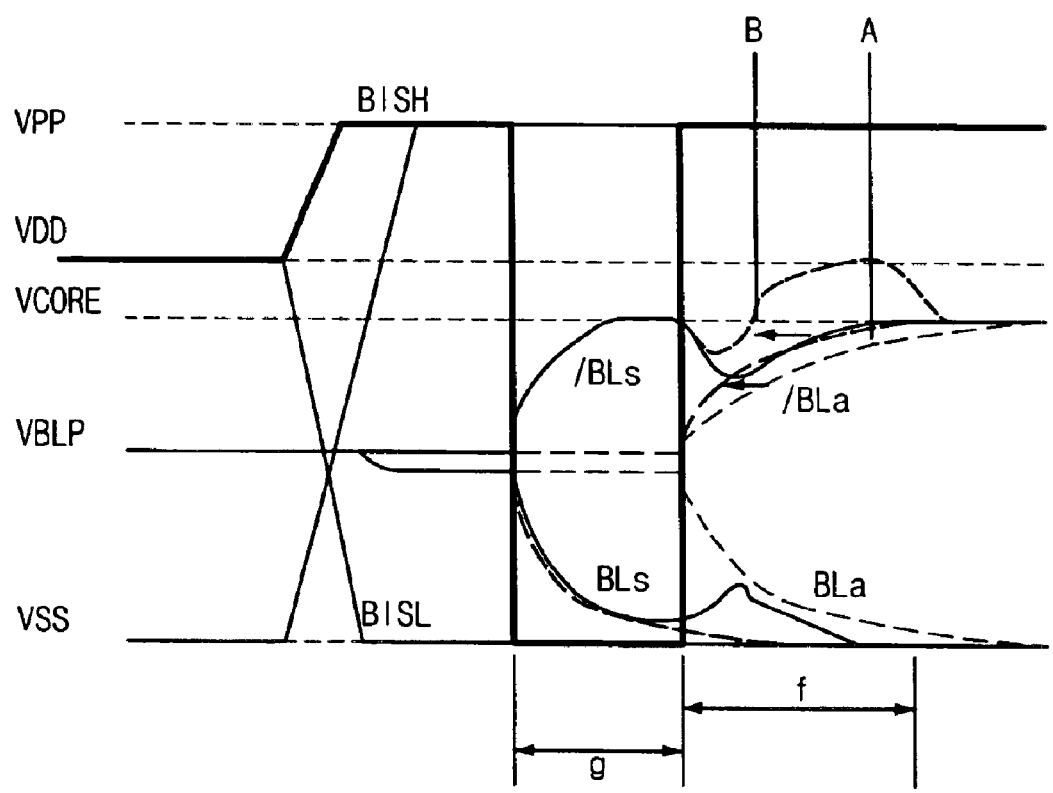
FIG. 11c is a timing diagram illustrating the operation of the semiconductor memory device of FIG. 8 when the overdrive control signal generator of FIG. 11a is used.

FIG. 11c is a timing diagram illustrating the operation of the semiconductor memory device of FIG. 8 when the overdrive control signal generator 23 of FIG. 11a is used.

The sense amplifier control signal RTO is not overdriven while the sense amplifier array 4 is temporarily separated from the selected memory cell array 3a. Specifically, the overdrive operation is not performed from the start point when the sense amplifier array 4 is temporarily separated from the selected memory cell array 3a to the delay time DE2 of the first delay unit 25. However, the overdrive operation is performed for an interval f where the delay time DE3 of the second delay unit 26 is added to the same time as an interval while the sense amplifier array 4 is temporarily separated from the selected memory cell array 3a.

As a result, the timing when data of the bitline BLs reach the core voltage VCORE moves from the point A to the point B. That is, since the activation timing of the column selecting signal YI is advanced, the parameter tRCD is improved.

As described above, a semiconductor memory device according to an embodiment of the present invention performs an overdrive operation when a sense amplifier array is temporarily separated from a selected memory cell array so that a sense amplifier may perform a rapid sense and amplification operation. The overdrive operation of providing a power voltage VDD or a higher voltage as a source voltage RTO of the sense amplifier prevents a level of a bitline of the memory cell array from being dropped temporarily. As a result, the restoration time of data stored in the memory cell can be reduced.

Also, since data of the bitline is rapidly amplified, the precharge time of the bitline is advanced.

Additionally, since the data of the bitline is rapidly amplified, the parameter tRCD is improved.

Therefore, the operation speed of the semiconductor memory device can be improved.

While the present invention is susceptible to various modifications and alternative forms, specific embodiments have been shown by way of example in the drawings and described in detail herein. However, it should be understood that the invention is not limited to the particular forms disclosed. Rather, the present invention covers all modifications, equivalents and alternatives falling within the spirit and scope of the present invention as defined in the appended claims.

What is claimed is:

1. A semiconductor memory device comprising:
    a plurality of memory cell arrays comprising a plurality of memory cells;
    a plurality of sense amplifiers for sensing and amplifying data stored in the plurality of memory cells;
    a connection means for selectively connecting the plurality of sense amplifiers to the plurality of memory cell arrays;
    a driver for driving a sense amplifier of the plurality of sense amplifiers to a predetermined voltage; and
    an over-driver for applying an overdrive voltage to the driver for a predetermined time after the sense amplifier of the plurality of sense amplifiers is temporarily separated from the selected memory cell array.

2. The device according to claim 1, wherein the over-driver comprises
    a switch for selectively applying the overdrive voltage to the driver; and
    a switch control signal generator for generating a switch control signal to control the switch in response to a separation control signal;
    wherein the separation control signal temporarily separates the sense amplifier of the plurality of sense amplifiers from the selected memory cell array.

3. The device according to claim 2, wherein the switch control signal generator comprises a pulse generator for generating a pulse using the separation control signal.

4. The device according to claim 3, wherein the switch control signal generator further comprises a delay means for delaying the separation control signal for a predetermined time.

5. The device according to claim 4, wherein the delay means delays the separation control signal during an interval where the sense amplifier of the plurality of sense amplifiers is temporarily separated from the selected memory cell array.

6. A method for overdriving a sense amplifier of a semiconductor memory device, comprising the steps of:
    connecting the sense amplifier to a selected memory cell and transmitting data stored in the memory cell into a bitline;
    sensing and amplifying data on the bitline; and
    precharging the bitline after the sense and amplification step,
    wherein the sense and amplification step comprises the steps of:
    separating the sense amplifier from the selected memory cell for a predetermined time; and
    overdriving the sense amplifier.

7. The method according to claim 6, wherein the separation step is performed in the initial stage of the sense and amplification step.

8. The method according to claim 6, wherein the overdrive step is performed from the start point of the separation step to a predetermined time after the end point of the separation step.

9. The method according to claim 6, wherein the overdrive step is performed from a first predetermined time after the start point of the separation step to a second predetermined time after the end point of the separation step.

10. The method according to claim 9, wherein the first predetermined time corresponds to the interval of the separation step.

* * * * *